United States Patent [19]
Donofrio et al.

[11] 3,764,823

[45] Oct. 9, 1973

[54] TIMED TRUE AND COMPLEMENT GENERATOR

[75] Inventors: Nicholas M. Donofrio; Douglas W. Kemerer, both of Essex Junction, Vt.; John Raymond, Jr., Wappingers Falls, N.Y.

[73] Assignee: International Business Machines Corporation, Armonk, N.Y.

[22] Filed: Dec. 29, 1972

[21] Appl. No.: 319,435

[52] U.S. Cl. .................................. 307/205, 307/265

[51] Int. Cl. .......................................... H03k 19/08

[58] Field of Search ................ 307/205, 221 C, 251, 307/279, 304, 265

[56] References Cited

UNITED STATES PATENTS

| | | | |
|---|---|---|---|
| 3,267,295 | 8/1966 | Zuk | 307/205 |
| 3,679,913 | 7/1972 | Foltz | 307/251 |
| 3,710,271 | 1/1973 | Putman | 307/304 |
| 3,581,226 | 5/1971 | Perkins | 330/30 D |

*Primary Examiner*—John W. Huckert
*Assistant Examiner*—R. E. Hart
*Attorney*—Theodore E. Galanthay et al.

[57] ABSTRACT

Disclosed is a true complement generator for providing the true and complement values of an input signal as an output, in response to predetermined timing signals. A first portion of the true complement generator is a gated inverter circuit generating a complement output. A second portion of the true complement generator is a gated driver circuit generating a true output. The true and complement phases of the input signal appear at the respective output nodes during the occurrence of a first timing signal, while both output nodes are held to the same level during the occurrence of a second timing signal.

6 Claims, 2 Drawing Figures

TIMED TRUE AND COMPLEMENT GENERATOR

CROSS-REFERENCES TO RELATED APPLICATIONS OR PATENTS

Sonoda, U.S. Pat. No. 3,564,290, issued Feb. 16, 1971 and assigned to the assignee of the present invention.

BACKGROUND OF THE INVENTION

1. Field of the Invention

This is a true complement generator for providing, as outputs, the true and complement values of an input signal and more specifically providing the stated output in response to a timing signal.

2. Description of the Prior Art

True complement generating circuits for generating the true and complement values of an input signal are well known in the art. In their simplest form, an inverter provides the complement value of an input signal while the true value is provided by a straight-through wire connection. The numerous variations of this basic concept found in both the patented and published art illustrate that various improvements and increased degrees of sophistication are required to solve newly arising problems. Thus, the mere generation of true and complement outputs (being synonymous with the generation of in phase and out of phase outputs) of a given input signal is frequently insufficient. Demands for increased speed, reduced power dissipation, and precisely timed relationships between various signals in the circuit frequently require circuits having novel structure, mode of operation, and results not found in the prior art. In integrated circuit technology, a further requirement arises that the desired circuit be embodied in a minimum space within the monocrystalline semiconductor body. In field effect transistor technology, it is further desirable to embody the entire circuit in field effect transistors and capacitors and it is further desirable to be able to limit the size of the field effect transistors and the values of capacitance as much as possible. Field effect transistor circuits must also consider the threshold voltage drop inherent in field effect transistors which must be overcome. Furthermore, since field effect transistors are voltage controlled devices, as opposed to current controlled devices, the driving of highly capacitive loads at relatively high speeds raises additional problems. There is no known prior art circuit advantageously combining all the foregoing desired characteristics of a timed true complement generator implemented in an integrated circuit structure having field effect transistors.

SUMMARY OF THE INVENTION

It is accordingly a primary object of this invention to provide an improved true complement generator providing the true and complement values of an input signal in response to predetermined timing signals.

It is another object of this invention to provide a true complement generator readily integratable in field effect transistor technology.

It is a still further object of this invention to provide an improved true complement generator with a minimum power dissipation.

In accordance with the present invention, a true complement generator implemented in field effect transistor technology is provided. The exemplary preferred embodiment shows N channel field effect transistors having drain, source, and gate electrodes. The drain and source electrodes are commonly referred to as gated electrodes while the gate electrode is referred to as a gating electrode. N channel field effect transistors have the further characteristics of being conditioned "on" into the conductive state by up level signals on the gating electrodes and being held "off" when the gating electrode is held at a down level.

Accordingly, the present exemplary embodiment has a complement stage for generating the complement (out of phase) output and including transistors T11, T13, T15, T17, T19 and T20; and a true stage for generating the true (in phase) output including transistors T12, T14, T16, and T18. Transistor 10 provides a gated pulse power source eliminating DC power dissipation. Initially, the phase 1 timing pulse is at a down level and the phase 2 timing pulse is at an up level. At this point in time both the true and complement outputs are down since T13 and T14 are on. T10 is off insuring no DC power dissipation. T11 on biased on while T12 and T15 are either on or off, depending on the potential level of the input signal. When the phase 1 pulse is raised to the up level and the phase 2 pulse is brought to the down level, then T13, T14, and T19 are turned off and T10 is turned on. If the input signal is at an up level, T11 is turned off through T17 and T20 while T15 keeps the complement output at a down level. T16 remains off so that the true output is charged to an up level through T12. Feedback to the gate of T12 through capacitor C2 is isolated from the input signal by T18. However, if the input is down, T15 is off and the complement output charges to an up level through T11. T12 remains off and the true output is held at a down level by T16.

It is here noted that the same circuit embodied in P channel field effect transistor technology would merely require the reversal of the polarity of the sources of power, and the input signals including the timing signals. This is in accordance with the fact that P channel devices are conditioned "on" into the conductive state by down level signals instead of up level signals.

The foregoing and other objects, features and advantages of this invention will be apparent from the following more particular description of the preferred embodiments of the invention, as illustrated in the accompanying drawing.

DESCRIPTION OF THE PREFERRED EMBODIMENT

Figure 1:
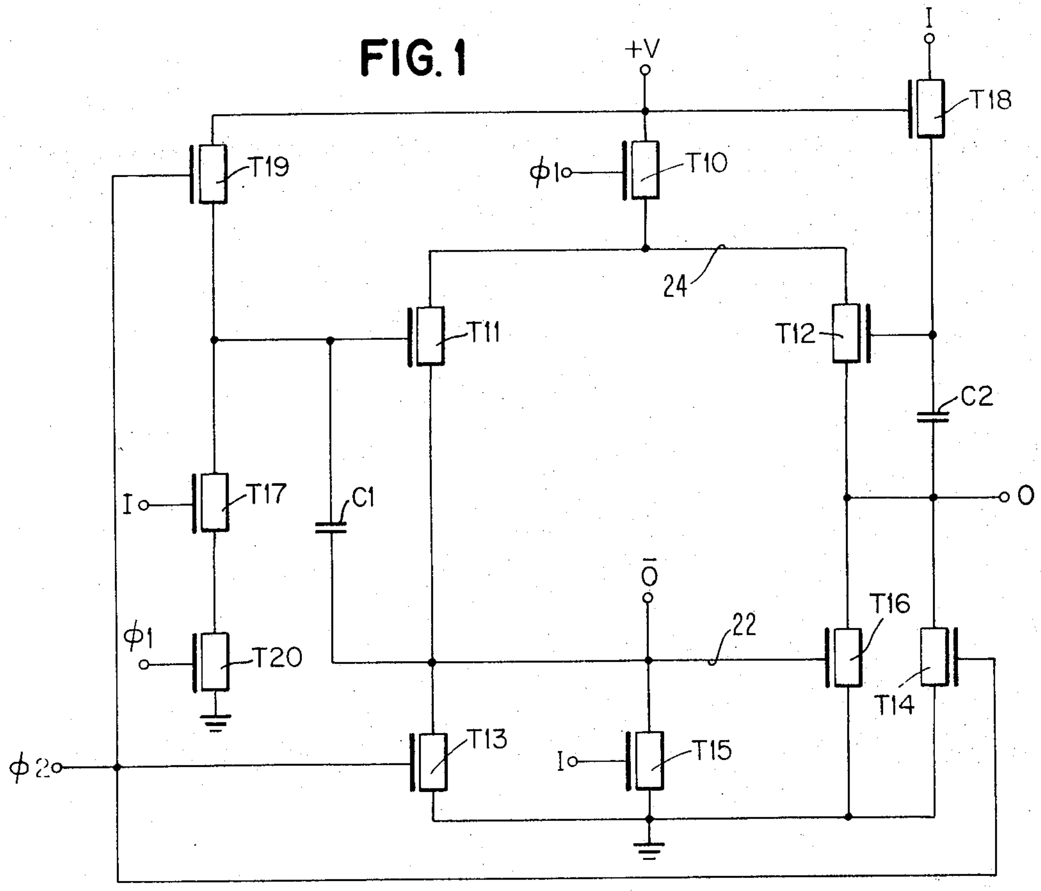
FIG. 1 is a circuit diagram of a preferred embodiment of this invention.

Refer now to FIG. 1 showing the preferred embodiment of this invention implemented in N channel field effect technology. The input node has been designated by "I" and is shown at three separate terminals for ease of illustration. The true output node has been designated as a terminal referenced as "O" while the complement output node has been designated as a terminal referenced by "$\overline{O}$." The circuit receives first and second sources of power, the first source of power being the positive voltage (+V) and the second source being ground potential. The actual value of +V is approximately 10 volts although the actual value is variable over a large range depending on the particular field effect transistor technology used to construct this circuit. A first timing signal is designated as phase 1 or $\phi 1$ while a second timing signal has been designated as phase 2 or $\phi 2$. The appropriate symbols have been placed adjacent the terminals where they are applied. The first and second timing signals essentially provide periodic connection of the designated terminals to the first and second sources of power. Thus, the potential swing of the timing signals between their down and up levels is approximately from 0 to 10 volts. The voltage swing of the input signal is in a similar range. The foregoing range of voltage swings is desirable but not required; the only requirement being that the up level be sufficient to condition the corresponding field effect transistor into its conducting state.

The first portion of the true complement generator generates a complement (out of phase) output at the complement output node $\overline{O}$ and is basically a gated inverter circuit. A first switch means T15 is connected between the complement output node $\overline{O}$ and the second source of power (ground). The gating electrode of T15 is connected to the input node. A second switch means transistor T13 is in electrical parallel with T15 and has its gating electrode connected to phase 2 timing signal. A third switch means transistor T11 is connected in an electrical series path between the first source of power +V and the second source of power (ground); the electrical series path including the parallel connection of T13 and T15. Also included in the just mentioned electrical series paths is transistor T10 connected between +V and T11. T10 has its gating electrode connected to the phase 1 timing signal, and provides a periodic connection to the +V source of power. A first feedback capacitance C1 is connected between the gating electrode of T11 and one of the gated electrodes of T11 as shown in FIG. 1. Transistor T19 is connected between +V and the gating electrode of T11 providing a drain to source path through T19 for charging the first feedback capacitor C1. The gating electrode of T19 is connected to the phase 2 timing signal. A discharge path for capacitor C1 to ground is provided by the series connection of transistors T17 and T20 which are connected between the gating electrode of T11 and ground potential. T17 has its gating electrode connected to the input node while T20 has its gating electrode connected to the phase 1 timing pulse. The foregoing completes the description of the interconnections of the complement generating portion of the true complement generator as well as the connection of gating switch T10.

The second portion of the true complement generator generates the in phase output and provides it at the output terminal O. The second portion includes a fourth switch means transistor T14 connected between the output node O and ground. T14 also has its gating electrode connected to the phase 2 timing signal. The fifth switch means transistor T16 is connected in parallel with T14 and has its gating electrode connected to the complement output node. The sixth switch means transistor T12 is connected between T10 and the output node O and corresponds to T11 in the first portion. A second feedback capacitor C2 is connected between the gating electrode of T12 and one of the gated electrodes of T12. Capacitor C2 is charged through the drain to source path of charging transistor T18 which is connected between the input node and the gating electrode of T12 and has its gating electrode connected to the +V source of power.

OPERATION

In operation, the first portion of the circuit consisting of transistors T11, T13, T15, T17, T19 and T20 is a first means for generating a complement output at the complement output node, and operatively connected to the input node and responsive to input signals thereon, and also responsive to first and second timing signals. Assume that initially, the phase 1 timing signal is at a down level and the phase 2 timing signal is at an up level. This conditions transistor T20 off while T13 is conditioned on. Accordingly, the output node is held at a down level regardless of the state of the input signal. Assuming at this point that the input is also at an up level, then transistors T15 and T17 are also conditioned on. The phase 2 timing signal being at an up level also turns charging transistor T19 on charging capacitor C1 to an up level. Note that this up level is usually one threshold drop below +V because of the drop through transistor T19. This up level conditions transistor T11 to an on state which equalizes the potential across the two gated electrodes of T11, but there is no further current conduction until such time as T10 is turned on. The cooperative structural relationship and operation of transistor T11 and its associated feedback capacitor C1 is described in great detail in the Sonoda, U.S. Pat. No. 3,564,290. The information contained in this referenced patent is incorporated herein.

Assuming that the input signal remains at an up level when the phase 2 pulse goes to a down level and the phase 1 pulse comes to an up level, then it is seen that the complement output will remain at a down level because of the conduction of T15. Also, T17 and T20 both receiving up level inputs are both "on" thereby discharging capacitor C1 and holding the gating electrode of T11 at a down level. Phase 2 being at a down level also holds T19 off. Accordingly, even though T10, T17 and T20 and T15 are all on, there is no DC current path between the first and second sources of power.

Figure 2:
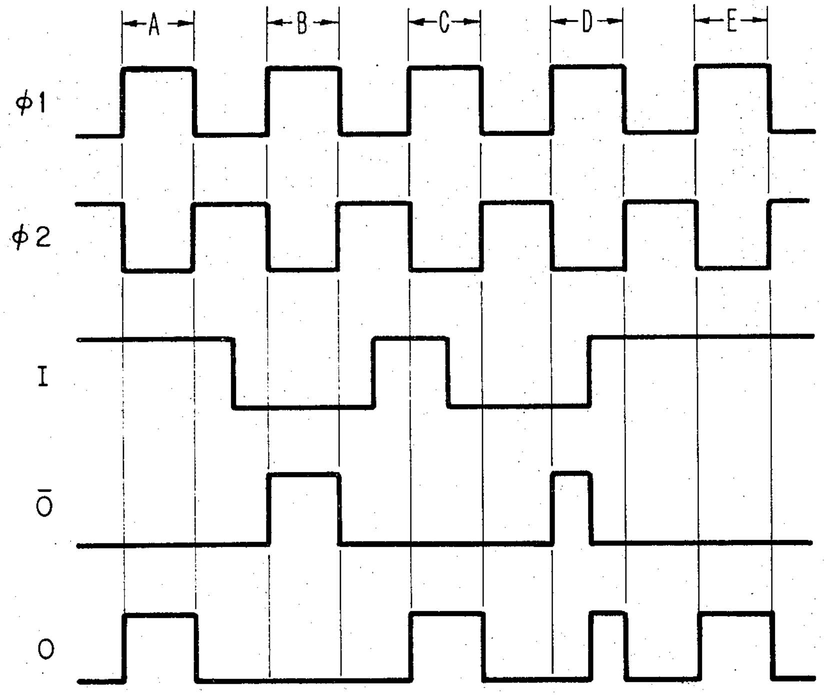
FIG. 2 is a waveform diagram illustrating the timing relationship between the phase 1 and phase 2 pulses.

Assume now that the first timing signal ($\phi$)1 returns to a down level while the second timing signal ($\phi 2$) returns to an up level. There continues to be no change in the down level of the complement output as it is held to a down level by the conduction of T13. For the same reason, as the signal on the input node goes to a down level, even though this conditions T15 and T17 off, there is no change in the down level state of the complement output node. However, as the input node continues at a down level and the phase 1 signal is brought to an up level as the phase 2 level is brought to a down level, transistors T10 and T20 are turned on while T13 and T19 are turned off. Even though T20 is on, there is no discharge path for capacitance C1 because T17 remains off. Accordingly, T11 remains conditioned on as T10 is turned on providing a current path to bring the complement output $\overline{O}$ to an up level. The regenerative feedback action of capacitor C1 brings the gate electrode of T11 up as the complement output node is brought up, thereby overcoming the threshold voltage drop of T11. The complement output will therefore remain at an up level so long as both the input signal and the phase 2 timing signal are at a down level. Accordingly, as further exemplified in the waveform diagram of FIG. 2, the duration of the output signal is determined by the duration of the timing signals. So long as there is no transition in the level of the input signal during the occurrence of the phase 1 timing signal, the outputs will appear for the duration of the phase 1 timing pulse as illustrated in FIG. 2 at timing frames A, B and E. In the event that the input signal changes state during the occurrence of a phase 1 timing signal as illustrated in time frames C and D, an undesirable result (i.e., undefined output) might occur. As for example, in time frame D, an up swing of the input signal results in the conduction of T15 bringing the complement output to a down level. In time frame C when the input signal goes to a down level during the occurrence of a phase 1 timing signal, the complement output might remain at the down level so long as no current flows into the output node from an external source connected to the complement output. In either event it is desirable for the input signal to have transitions between the time frames of interest, even though the true complement relationship of the output is established during the occurrence of the phase 1 timing signal.

In order to generate a true output at the true output node, a second portion of the true complement generating circuit is provided. This second portion is operatively connected to the input node by one of the gated electrodes of charging transistor T18. The second portion is also connected to the first source of power (+V) by the gating electrode of charging transistor T18. A connection to the second source of power (ground) is by one of the gated electrodes of each of T14 and T16. The first and second portions of the true complement generator are operatively connected by common connections generally designated by conductive lines 22 and 24. The operative connection 22 between the complement output node and the gating electrode of the fifth switch means T16 assures that the true output node will be at a down level whenever the complement output node is at an up level by connecting the true output node to ground potential. The operative connection 24 assures that the up going transitions of the output nodes will occur in the same time relationship to the up going edge of the phase 1 timing pulse. Therefore, depending on whether T11 or T12 are conditioned conductive prior to the occurrences of the phase 1 timing signal, the corresponding output node will rise with the up going phase 1 timing signal. The alternate true complement output node will remain at the down level where both output nodes are held by the phase 2 timing pulse through T13 and T14 prior to the occurrence of the phase 1 timing pulse.

What has then been described is a timed true complement generator providing the true and complement values of an input signal in precise relationship to predetermined timing signals. The circuit is readily integratable in field effect transistor technology, provides driving signals for highly capacitive loads and consumes no DC power as there is never a completely conductive current path between the two potential levels of the power source.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A true complement generator for providing the true and complement values of an input signal as an output, in response to predetermined timing signals, comprising:

an input node;

a true output node;

a complement output node;

first and second sources of power;

first and second timing signals for providing periodic connection to said first and second sources of power;

first means for generating a complement output at the complement output node, and operatively connected to said input node and responsive to input signals thereon, and also responsive to said first and second sources of power and said first and second timing signals; and second means for generating a true output at the true output node and also operatively connected to said input node and responsive to input signals thereon, and also responsive to said first and second sources of power and second timing signal, said first and second means being operatively interconnected such that during the occurrence of said first timing signal the true value of an input signal appears at the true output node and the complement value of an input signal appears on the complement output node.

2. Apparatus as in claim 1 in which said first and second timing signals are mutually exclusive.

3. Apparatus as in claim 1 wherein said first and second means comprise:

a plurality of switch means including field effect transistors each having two gated electrodes and a gating electrode.

4. Apparatus as in claim 3 in which said first means for generating a complement output at the complement output node is a gated inverter circuit comprising:

first switch means connected between the complement output node and said second source of power and also connected to said input node;

second switch means in electrical parallel with said first switch means and also connected to said second timing signal;

third switch means connected in an electrical series path between said first and second sources of power, said electrical series path including the parallel connection of said first and second switch means; forming a common connection for said first, second, and third switch means;

a first feedback capacitance connected between the common connection formed by said first, second and third switch means and the gating electrode of said third switch means;

means for charging said capacitor during the occurrence of said second timing signal; and means for discharging said capacitor during the occurrence of said first timing signal and an input signal.

5. Apparatus as in claim 3 wherein said second means fo generating a true output at the true output node is a gated driver circuit comprising:

fourth switch means connected between said true output node and said second source of power and also connected to said second timing signal;

fifth switch means connected in electrical parallel with said fourth switch means and also connected to said complement output node;

sixth switch means including a field effect transistor having one of its gated nodes connected to the true output node and a second feedback capacitance connected between a gating electrode of said sixth switch means and said output node; and means for charging said second capacitor during the occurrence of an input signal.

6. Apparatus as in claim 3 wherein said first and second means have a common connection further comprising:

a gating switch connected between said first source of power and said common connection for providing periodic connection of said common connection to said first source of power during the occurrence of said first timing signal.

* * * * *